United States Patent
Baillin

(10) Patent No.: US 10,221,063 B2
(45) Date of Patent: Mar. 5, 2019

(54) MULTI-LEVEL GETTER STRUCTURE AND ENCAPSULATION STRUCTURE COMPRISING SUCH A MULTI-LEVEL GETTER STRUCTURE

(71) Applicant: Commissariat A L'Energie Atomique et aux Energies Alternatives, Paris (FR)

(72) Inventor: Xavier Baillin, Crolles (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 31 days.

(21) Appl. No.: 14/966,450

(22) Filed: Dec. 11, 2015

(65) Prior Publication Data
US 2016/0176703 A1 Jun. 23, 2016

(30) Foreign Application Priority Data

Dec. 17, 2014 (FR) .................................. 14 62587

(51) Int. Cl.
*H01L 23/20* (2006.01)
*B81B 7/00* (2006.01)
*B81C 1/00* (2006.01)

(52) U.S. Cl.
CPC ........ *B81B 7/0038* (2013.01); *B81C 1/00285* (2013.01); *B81B 2207/115* (2013.01);
(Continued)

(58) Field of Classification Search
CPC ....... H01L 23/20; H01L 23/26; H01L 23/564; B81B 7/0038; B81B 2207/115;
(Continued)

(56) References Cited

U.S. PATENT DOCUMENTS 6,039,620 A * 3/2000 Itoh .......................... H01J 9/38
445/25
8,414,963 B2 4/2013 Baillin
(Continued)

FOREIGN PATENT DOCUMENTS

EP 002261620 A1 * 12/2010
FR 2 922 202 A1 4/2009
(Continued)

OTHER PUBLICATIONS

French Preliminary Search Report dated May 29, 2015 in French Application 14 62587, filed on Dec. 17, 2014 (with English Translation of Categories of Cited Documents).
(Continued)

*Primary Examiner* — Kimberly Rizkallah
*Assistant Examiner* — Dilinh Nguyen
(74) *Attorney, Agent, or Firm* — Oblon, McClelland, Maier & Neustadt, L.L.P.

(57) ABSTRACT

A getter structure is provided, including a support; a first layer of getter material disposed on the support a second layer of getter material, the first layer of getter material being disposed between the support and the second layer of getter material; a first portion of material mechanically connecting a first face of the second layer of getter material to a first face of the first layer of getter material and forming at least one first space between the first faces of the first and second layers of getter material configured to allow a circulation of gas between the first faces of the first and second layers of getter material; and a first opening crossing through at least the second layer of getter material and emerging into the first space.

19 Claims, 4 Drawing Sheets

(52) U.S. Cl.
CPC .. *B81C 2201/053* (2013.01); *B81C 2203/019* (2013.01); *B81C 2203/0145* (2013.01)

(58) Field of Classification Search
CPC ........ B81C 1/00285; B81C 2203/0145; B81C 2203/019; B81C 2201/053
USPC .......................................................... 257/682
See application file for complete search history.

(56) References Cited

U.S. PATENT DOCUMENTS

| | | | |
|---|---|---|---|
| 8,605,445 B2 | 12/2013 | Baillin | |
| 9,005,353 B2 | 4/2015 | Caplet | |
| 9,051,173 B2 | 6/2015 | Baillin et al. | |
| 2004/0134484 A1* | 7/2004 | Barkai | F24J 2/055 126/653 |
| 2006/0138954 A1* | 6/2006 | Kato | H01J 9/261 313/553 |
| 2007/0026428 A1 | 2/2007 | Chelur | |
| 2010/0001361 A1 | 1/2010 | Caplet et al. | |
| 2010/0003789 A1 | 1/2010 | Caplet et al. | |
| 2010/0178419 A1 | 7/2010 | Baillin | |
| 2010/0193215 A1 | 8/2010 | Baillin | |
| 2011/0079425 A1 | 4/2011 | Baillin et al. | |
| 2011/0079889 A1 | 4/2011 | Baillin | |
| 2012/0112334 A1* | 5/2012 | Baillin | H01L 23/26 257/682 |
| 2012/0325091 A1 | 12/2012 | Caplet | |
| 2012/0328779 A1 | 12/2012 | Caplet et al. | |

FOREIGN PATENT DOCUMENTS

| | | |
|---|---|---|
| FR | 2 933 389 A1 | 1/2010 |
| FR | 2 933 390 A1 | 1/2010 |
| FR | 2 950 876 A1 | 4/2011 |
| FR | 2 976 932 A1 | 12/2012 |
| FR | 2 976 933 A1 | 12/2012 |
| WO | WO 2014/099123 A1 | 6/2014 |

OTHER PUBLICATIONS

U.S. Appl. No. 12/494,123, filed Jun. 29, 2009, Stephane Captel et al.
U.S. Appl. No. 12/494,147, filed Jun. 29, 2009, Stephane Captel et al.
U.S. Appl. No. 13/764,244, filed Feb. 11, 2013, Xavier Baillin et al.
U.S. Appl. No. 14/331,285, filed Jul. 15, 2014, Xavier Baillin et al.
U.S. Appl. No. 14/555,913, filed Nov. 28, 2014, Xavier Baillin.
U.S. Appl. No. 14/408,478, filed Jun. 25, 2013, Xavier Baillin et al.
U.S. Appl. No. 14/725,028, filed May 29, 2015, Xavier Baillin.
U.S. Appl. No. 14/857,047, filed Sep. 17, 2015, Xavier Baillin.
U.S. Appl. No. 14/883,003, filed Oct. 14, 2015, Xavier Baillin.
U.S. Appl. No. 14/882,961, filed Oct. 14, 2015, Xavier Baillin.

* cited by examiner

MULTI-LEVEL GETTER STRUCTURE AND ENCAPSULATION STRUCTURE COMPRISING SUCH A MULTI-LEVEL GETTER STRUCTURE

TECHNICAL FIELD AND PRIOR ART

This document relates to a multi-level getter structure, as well as to an encapsulation structure including a hermetic cavity in which are encapsulated one or more micro-devices, also called micro-systems or micro-components, for example of MEMS (micro electro mechanical system), NEMS (nano electro mechanical system), MOEMS (micro opto electro mechanical system), NOEMS (nano opto electro mechanical system) type, or of infrared micro-detector type, and one or more multi-level getter structures. This document also relates to a method for producing such a multi-level getter structure, as well as methods for encapsulating at least one micro-device making it possible to produce an encapsulation structure of the micro-device comprising one or more multi-level getter structures.

Some micro-devices, such as those of MEMS, NEMS, MOEMS, NOEMS type or infrared micro-detectors, require for their correct operation to be hermetically enclosed, or encapsulated, in a cavity of which the atmosphere is controlled (control of the nature of the gas(es) present in the cavity and/or the pressure in the cavity).

Such an encapsulation may be carried out collectively for several micro-devices produced on a same substrate (or wafer), called first substrate. Each of the micro-devices is then encapsulated in a cavity obtained by the transfer and the hermetic bonding of a cover, for example formed by a second silicon or glass substrate, on the first substrate. This hermetic assembly between the first and the second substrates, called "wafer-to-wafer", or W2W, and making collectively the encapsulation cavities of the micro-devices, makes it possible to protect the atmosphere reigning in the cavities while preventing leaks of gas between the inside of the cavities and the environment external to the encapsulation structure. In a variant, the cavities may be obtained by a TFP (Thin Film Packaging) type encapsulation, the covers being in this case formed of one or more superimposed thin layers.

The addition of non-evaporable getters (NEG) in the cavities, for example in the form of portions of getter material arranged in these cavities, makes it possible to control the characteristics of the atmosphere within the cavities. The portions of getter material may be produced from a thin layer deposition of the getter material on the first substrate and/or, in the case of a W2W encapsulation, on the second substrate, prior to the operation of assembly between the two substrates. A shaping of the portions of getter material in the plane of the surface of the substrate on which the getter material is deposited is then carried out by implementing technological operations of photolithography and etching of the thin layer of getter material.

In the case of PCM encapsulation, the getter material may be produced in the form of a thin layer corresponding to the first layer of a stack of layers intended to form the cover and thereby forming the inner wall of the cover which is exposed to the inside of the cavity.

In a variant, it is possible to deposit the getter material discretely, directly in the desired form. To do so, the getter material may be deposited directly on one and/or the other of the two substrates either through a stencil, or by lift-off, through a film of photosensitive resin shaped beforehand by photolithography, this film being removed after the deposition of the getter material there through.

In general, during W2W assembly, the deposition of the getter is monolithic and of square or rectangular shape, and only the face opposite to the face in contact with the host substrate is in contact with the atmosphere of the cavity. The getter may be deposited on the substrate which hosts the device, or on the substrate forming the cover. In the case of PCM encapsulation, the getter may be deposited in a manner identical to the preceding case on the substrate, or on the sacrificial layer with the cover layer which is then obtained by covering the getter and the sacrificial layer.

For some applications, particularly the individual packaging of micro-bolometers each forming a pixel of a detection array (each pixel is packaged independently of the others), the integration of a getter material in the encapsulation structures poses problems on account of the little space available, or instead on account of the aggressive methods implemented during the integration of the getter material which lead to reducing its gaseous pumping capacity, or gas absorption/adsorption capacity.

A solution thus needs to be found to increase the pumping capacity of the getter material without increasing its bulk.

In order to increase the surface of getter material exposed, the document FR 2 976 933 A1 describes a getter structure formed by a getter material deposited on a material permeable to gases and such that the face of the getter material in contact with the material permeable to gases is capable of performing a gaseous adsorption/absorption via this permeable material. The getter structure may also comprise several portions of getter material superimposed on each other and spaced apart by portions of material permeable to gases. This getter structure makes it possible to multiply by two the pumping capacity of each of the portions of getter material of the getter structure.

However, this getter structure is based on the use of a porous layer (for example a $SiO_xC_y$ type compound deposited by CVD, or chemical vapour deposition, or a metal deposited by PVD, or physical vapour deposition) of which it is necessary to know how to manage the structure so as to assure good porosity of the material (a compromise must be found between porous structure and dense structure, considering that the mechanisms of growing metal deposits enabling such a structure are situated towards low temperatures, close to room temperature, depending on the metals). It is also necessary to assure the chemical stability of the porous layer when it comprises $SiO_xC_y$ since it contains oxygen and carbon and thus risks being reactive vis-à-vis the ambient atmosphere, which necessitates protecting it rapidly after deposition. Finally, the production of such a getter structure involves producing portions of getter material and portions of permeable material according to different patterns, as well as covering the whole of the stack with a protective layer.

Furthermore, when the material permeable to gases is formed by an etched structure comprising channels, these channels have to be covered by the deposition of getter material without nevertheless being blocked by it. The width of the channels is thus limited to several microns. The surface of getter material, at the level of its face which is in contact with the channels, is thus also limited.

The document FR 2 933 389 A1 describes a suspended getter structure for which the upper face and a part of the lower face of the getter material are capable of trapping the gases which surround it. In this structure, the portion of getter material is deposited on a support itself arranged on a substrate. Thanks to the support, this structure makes it possible to increase the gas absorption/adsorption surface compared to a same portion of getter material deposited directly on the substrate. Nevertheless, the increase in the pumping capacity obtained remains limited.

The document FR 2 933 390 A1 describes the production of a PCM type encapsulation structure in which the layer of getter material is used to form the cover of the encapsulation structure or to form a separation layer between two cavities superimposed on each other. In this second case, the portion of getter material is exposed by these two faces, which approximately doubles its pumping capacity for an equivalent surface deposited on a support.

However, such an encapsulation structure comprising the layer of getter material forming a separation layer between two cavities superimposed on each other is limited to relatively small surfaces of getter material in order not to affect the mechanical stability of the getter material, this layer of getter material being uniquely anchored at the edges of the encapsulation structure.

To increase the absorption surface of a getter material, it is also known to deposit it on a surface having reliefs. However, the creation of such reliefs adds a certain number of technological operations complicating the encapsulation method.

DESCRIPTION OF THE INVENTION

Thus there is a need to propose a novel getter structure having reduced bulk, the surface of which is not limited particularly for reasons of mechanical stability and, for a given occupation surface, increased pumping capacity compared to getter structures of the prior art, and without having to resort to porous or gas permeable materials or to reliefs on the support on which the getter material is arranged.

To this end, one embodiment proposes a getter structure comprising at least:
one support;
one first layer of getter material arranged on the support;
one second layer of getter material such that the first layer of getter material is arranged between the support and the second layer of getter material;
one first portion of material mechanically connecting a first face of the second layer of getter material to a first face of the first layer of getter material and forming at least one first space between the first faces of the first and second layers of getter material enabling a circulation of gas between the first faces of the first and second layers of getter material;
one first opening crossing through at least the second layer of getter material and emerging into the first space.

In such a getter structure, the layers of getter material are arranged one on top of the other, which enables this structure to have a reduced bulk.

Such a getter structure can thus carry out an absorption and/or an adsorption of gas from the face of the second layer of getter material which is opposite to that in contact with the first portion of material (this face being able to form the upper face of the getter structure), but also from the first faces of the first and second layers of getter material thanks to the first space formed between these first faces and thanks to the first opening (or to the first openings) which places in communication the first space with the environment external to the getter structure. Thus, for a same occupation surface on the support, this getter structure makes it possible for example to multiply by around three (or even more if the getter structure comprises a greater number of layers of getter material) the gas absorption and/or adsorption capacity obtained compared to a single layer of getter material arranged on the support. In a more general manner, the getter structure makes it possible, with n layers of getter material (n being a whole number strictly greater than 1), to arrange $2n-1$ active faces of getter material, an active face corresponding to a face of a layer of getter material capable of being in contact with one or more gases to absorb and/or adsorb. It is thus possible, when the getter structure forms part of an encapsulation structure of a micro-device, to judiciously locate the getter structure in zones of the encapsulation structure which may be narrow and so as not to disrupt the operation of the micro-device.

Such a getter structure also has the advantage of being able to be produced with any geometry, according to the space available, and without being limited necessarily to small surfaces.

This getter structure is also compatible with all encapsulation structures, whether they are of W2W or PCM type, and is also compatible with a collective encapsulation of several micro-devices under controlled atmosphere.

The getter structure may further comprise at least:
one third layer of getter material such that the second layer of getter material is arranged between the first layer of getter material and the third layer of getter material;
one second portion of material mechanically connecting a first face of the third layer of getter material to a second face of the second layer of getter material and forming at least one second space between said faces of the second and third layers of getter material enabling a circulation of gas between said faces of the second and third layers of getter material;
one second opening crossing through at least the third layer of getter material and emerging into the second space.

In this configuration, for a same occupation surface on the support, this getter structure makes it possible for example to multiply by around five the gas absorption and/or adsorption capacity obtained compared to a single layer of getter material arranged on the support. The placing in communication of the first and second spaces with the external environment is achieved thanks to the first and second openings.

The getter structure may comprise n layers of superimposed getter material, spaced apart from each other and structured such that $2n-1$ active faces of getter material are capable of being in contact with one or more gases to absorb and/or adsorb, with n a whole number such that $n>1$. The $2n-1$ active faces may be intended to be exposed to the circulation of gas.

Each layer of getter material of the getter structure may or may not be formed of several sub-layers of getter material, that is to say formed of a stack of several layers of getter material arranged against each other.

Depending on the applications envisaged for the getter structure, the final layer of getter material of the getter structure (that is to say that the furthest from the support) may be covered with a layer specific to the targeted application. For example, for an application in the infrared domain, the final layer of getter material, forming a front face of the getter structure, may be covered with a reflective layer comprising for example aluminium.

The material of the first portion may be capable of being etched selectively compared to the getter materials of the first and second layers and/or, when the getter structure comprises the third layer of getter material, the material of the second portion may be capable of being etched selectively at least compared to the getter materials of the second and third layers (and potentially be also capable of being etched selectively compared to the getter material of the first layer). Thus, the first and second portions of material arranged between the different layers of getter material may be easily produced from layers of sacrificial material initially arranged between the layers of getter material.

When the material of the first portion is similar, or of same nature, to that of the second portion, this material may advantageously be capable of being etched selectively compared to the getter materials of the first, second and third layers of getter material.

The getter materials of the first and second layers may comprise at least Ti and/or Zr and/or V, and the material of the first portion may comprise at least Ru and/or Cr and/or Cu and/or Ni and/or Al and/or Au, and/or, when the getter structure comprises the third layer of getter material, the getter materials of the second and third layers may comprise at least Ti and/or Zr and/or V, and the material of the second portion may comprise at least Ru and/or Cr and/or Cu and/or Ni and/or Al and/or Au. More generally, the materials of the first and/or the second portions may comprise a metal or an alloy the etching of which may be carried out without significantly reducing the surface, or altering the pumping capacity, of the layers of getter material.

The getter structure may comprise:
several first portions of material mechanically connecting the first face of the second layer of getter material to the first face of the first layer of getter material, and/or
several first openings regularly spread out in the second layer of getter material, and/or
when the getter structure comprises the third layer of getter material, several second portions of material mechanically connecting the first face of the third layer of getter material to the second face of the second layer of getter material, and/or
when the getter structure comprises the third layer of getter material, several second openings regularly spread out in the third layer of getter material.

The getter structure may be such that:
the first opening(s) comprise a total surface, in a plane parallel to the second face of the second layer of getter material, less than or equal to around 20% of the total surface of the second face of the second layer of getter material, and/or
when the getter structure comprises the third layer of getter material, the second opening(s) comprise a total surface, in a plane parallel to a second face of the third layer of getter material opposite to the first face of the third layer of getter material, less than or equal to around 20% of the total surface of the second face of the third layer of getter material, and/or
a part of the surface of the first face of the second layer of getter material which is in contact with the first portion(s) of material is less than or equal to around 20% of the total surface of the second face of the second layer of getter material, and/or
when the getter structure comprises the third layer of getter material, a part of the surface of the first face of the third layer of getter material which is in contact with the second portion(s) of material is less than or equal to around 20% of the total surface of the second face of the third layer of getter material.

The second layer of getter material may comprise a section, in a plane parallel to the second face of the second layer of getter material, of rectangular frame shape or of grid shape, and/or, when the getter structure comprises the third layer of getter material, the third layer of getter material may comprise a section, in a plane parallel to the second face of the third layer of getter material, of rectangular frame shape or of grid shape.

The getter structure may further comprise at least one sub-layer for adjusting the thermal activation temperature of the getter material of the first layer, arranged between the support and the first layer of getter material and including at least one of the following elements: Ru, Pt, Cr, Cu, Ni, Al, and Au.

The getter structure may further comprise at least one protective layer covering at least one of the faces of one of the layers of getter material.

The material of the protective layer may comprise Au and/or Cr and/or an oxide of an alloy or a metal forming the getter material against which the protective layer is arranged and/or a nitride of the alloy or metal forming the getter material against which the protective layer is arranged.

The getter structure may further comprise at least one layer capable of reflecting an infrared radiation, arranged on a face of one of the layers of getter material and forming a front face of the getter structure.

Another embodiment relates to an encapsulation structure comprising at least one hermetically sealed cavity, delimited by first and second substrates and in which at least one micro-device is arranged on and/or in the first substrate, and further comprising at least one first getter structure as defined previously, in which the support of the first getter structure is formed by the first substrate and/or at least one second getter structure as defined previously and in which the support of the second getter structure is formed by the second substrate.

Another embodiment relates to an encapsulation structure comprising at least one hermetically sealed cavity, delimited by a substrate and a cover and in which at least one micro-device is arranged on and/or in the substrate, and further comprising at least one first getter structure as defined previously, forming at least one inner wall of the cavity and/or at least one second getter structure as defined previously and in which the support of the second getter structure is formed by the substrate.

Another embodiment relates to a method for producing a getter structure, comprising at least the implementation of the steps of:
producing at least one first layer of getter material on a support;
producing at least one first layer of sacrificial material on a first face of the first layer of getter material;
producing at least one second layer of getter material on the first layer of sacrificial material;
etching at least the second layer of getter material, forming at least one first opening crossing through at least the second layer of getter material;
etching a part of the first layer of sacrificial material through the first opening, such that the remaining sacrificial material of the first layer of sacrificial material forms at least one first portion of material mechanically connecting a first face of the second layer of getter material to the first face of the first layer of getter material, and forming at least one first space between the first faces of the first and second layers of getter material enabling a circulation of gas between the first faces of the first and second layers of getter material and into which emerges the first opening.

The step of etching at least the second layer of getter material may also etch the first layer of sacrificial material and the first layer of getter material according to a pattern similar to that of said at least one first opening.

To carry out simultaneously the etching of the first opening in the first and second layers of getter material as well as in the first layer of sacrificial material, a RIE (reactive ion etching) may be advantageously implemented. This embodiment may be implemented particularly when the layers of getter material cannot be etched selectively with respect to each other. This embodiment may be generalised for n layers of getter material (n>1) in which the openings enabling the circulation of gas may be produced individually or all simultaneously in each layer of getter material, while crossing through all the layers of getter material (particularly when the same getter material is used for all the layers of getter material) and layers of sacrificial material inserted between the layers of getter material, with the exception potentially of the first layer of getter material which may or may not be etched.

The method may further comprise, between the step of producing the second layer of getter material and the step of making the first opening, the implementation of the steps of:
  producing at least one second layer of sacrificial material on a second face of the second layer of getter material;
  producing at least one third layer of getter material on the second layer of sacrificial material;
  etching at least the third layer of getter material, forming at least one second opening crossing through at least the third layer of getter material;
  etching a part of the second layer of sacrificial material through the second opening, such that the remaining sacrificial material of the second layer of sacrificial material forms at least one second portion of material mechanically connecting a first face of the third layer of getter material to the second face of the second layer of getter material, and forming at least one second space between said faces of the second and third layers of getter material enabling a circulation of gas between said faces of the second and third layers of getter material and into which emerges the second opening,
and in which the etching of the second layer of getter material is carried out after the etching of the part of the second layer of sacrificial material and through the second opening. The etching of the first layer of sacrificial material may be carried out after the producing the first opening.

Another embodiment relates to a method for encapsulating at least one micro-device arranged on and/or in a first substrate, comprising at least the following steps:
  implementing a method for producing a first getter structure as defined previously and such that the support of the first getter structure is formed by the first substrate and/or a method for producing a second getter structure as defined previously and such that the support of the second getter structure is formed by a second substrate;
  joining together the first and second substrates, forming at least one hermetically sealed cavity, delimited at least by the first and second substrates and in which the micro-device is arranged.

Another embodiment relates to a method for encapsulating at least one micro-device arranged on and/or in a substrate, comprising at least the following steps:
  producing a portion of organic material on the substrate and covering at least the micro-device;
  implementing a method for producing a first getter structure as defined previously, the first layer of getter material being produced on the portion of organic material, and the first opening being made such that it crosses through the first layer of getter material and the second layer of getter material;
  etching the portion of organic material through the first opening and, when the first getter structure comprises the third layer of getter material, also through the second opening;
  sealing by depositing at least one sealing layer on the second layer of getter material at least at the first opening or, when the first getter structure comprises the third layer of getter material, on the third layer of getter material at least at the second opening.

The method for encapsulation may further comprise, prior to the production of the portion of organic material, the implementation of a method for producing a second getter structure as defined previously and such that the support of the second getter structure is formed by the substrate, and in which the portion of organic material is produced while covering the second getter structure.

Finally, another embodiment relates to a method for encapsulating at least one micro-device arranged on and/or in a substrate, comprising at least the following steps:
  implementing a method for producing a getter structure as defined previously and such that the support of the getter structure is formed by the substrate;
  producing a portion of organic material on the substrate and covering at least the micro-device and the getter structure;
  depositing at least one cover layer covering the portion of organic material;
  making at least one opening through the cover layer;
  etching the portion of organic material through the opening;
  depositing at least one sealing layer covering the cover layer at least at the opening.

The sealing layer may comprise at least one getter material.

BRIEF DESCRIPTION OF THE DRAWINGS

The present invention will be more fully understood on reading the description of embodiment examples, given for purely indicative purposes and in no way limiting, and by referring to the appended drawings in which.

Identical, similar or equivalent parts of the different figures described hereafter bear the same numerical references so as to make it easier to go from one figure to the next.

The different parts shown in the figures are not necessarily shown according to a uniform scale in order to make the figures more legible.

The different possibilities (variants and embodiments) should be understood as not being mutually exclusive and may be combined together.

DETAILED DESCRIPTION OF PARTICULAR EMBODIMENTS

Figure 1:
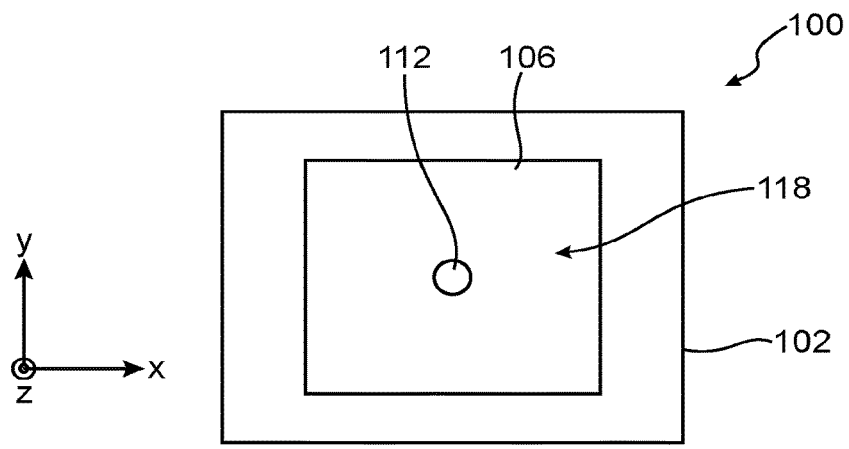
FIGS. 1 and 2 show respectively a top view and a sectional side view of a getter structure according to a first embodiment.
Figure 2:
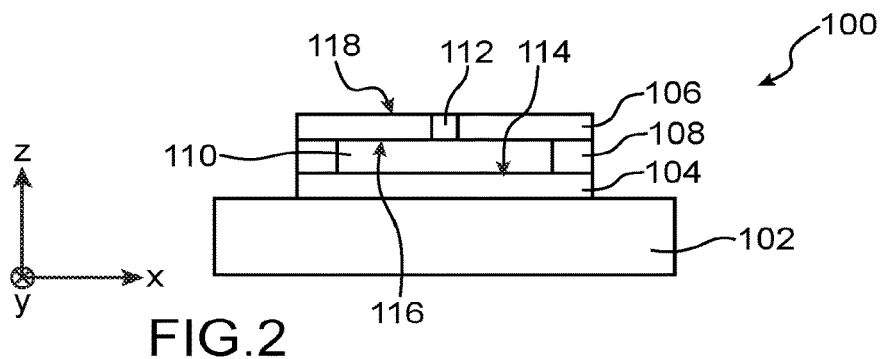

FIGS. 1 and 2 show respectively a top view and a sectional side view of a getter structure 100 according to a first embodiment.

The getter structure 100 comprises a support 102 here corresponding to a substrate for example made of semiconductor. The getter structure 100 comprises a first layer 104 of getter material arranged on the support 102, as well as a second layer 106 of getter material such that the first layer 104 is arranged between the support 102 and the second layer 106. The layers 104 and 106 here have substantially similar dimensions (heights, lengths and widths) and shapes. The second layer 106 is mechanically supported by one or more first portions 108 of material formed on the first layer 104 and spacing the layers 104 and 106 apart from each other while forming a first space 110 between these layers 104 and 106. In the example of FIGS. 1 and 2, a single first portion 108 is arranged between the layers 104 and 106, at the periphery of these layers 104, 106. The second layer 106 is crossed by one or more first openings 112 (only one in the example of FIGS. 1 and 2) making the first space 110 communicate with the external environment of the getter structure 100.

The layers 104 and 106 advantageously comprise titanium and/or zirconium and/or vanadium, or an alloy thereof. Generally speaking, the layers of getter materials may comprise any getter material of NEG type, for example including at least one of these two metals, and which may be for example deposited by PVD.

The first portion 108 comprises for example a metal material, including preferably Ru and/or Cr and/or Cu and/or Ni and/or Al and/or Au. Furthermore, due to the fact that the first portion 108 is derived from a layer of sacrificial material initially present between the layers 104 and 106, the material of the first portion 108 is advantageously a material which can be etched selectively vis-à-vis the getter materials of the layers 104 and 106 (the getter materials being in this case not very sensitive to the etching of the sacrificial material, and vice-versa). As an example, when the layers 104 and 106 comprise titanium (which may be etched advantageously by dry process), the first portion 108 may be derived from a layer of sacrificial material comprising Cu and/or Al and/or Cr, which are materials which are able to be etched selectively vis-à-vis titanium, advantageously by wet process.

The layers 104 and 106 each have for example a thickness (dimension along the axis Z in FIGS. 1 and 2) comprised between around 100 nm and 2 μm. The thickness of the first portion 108, which corresponds to the thickness of the layer of sacrificial material from which is derived the first portion 108, may be comprised between around 20 nm and 2 μm. When the sacrificial material may be deposited according to an electrolytic method, its thickness may be less than or equal to around 10 μm.

In contact with gaseous species, such a getter structure 100 thus carries out an absorption and/or an adsorption of gas from:

- a first face 114 of the first layer 104 which is exposed in the first space 110;
- a first face 116 of the second layer 106 which is exposed in the first space 110;
- a second face 118 of the second layer 106 which is opposite to the first face 116 and which here forms the upper face of the getter structure 100.

To a lesser extent, the gaseous absorption and/or adsorption is also carried out by the lateral faces (those substantially perpendicular to the faces 114, 116 and 118) of the layers 104 and 106 as well as by the side walls of the first opening 112.

Thus, compared to a getter structure which would be formed of a single layer of getter material arranged on the support 102 (for example uniquely the first layer 104) and which would thus carry out an absorption and/or an adsorption of gas uniquely through its upper face opposite to that in contact with the support 102, the getter structure 100 according to this first embodiment makes it possible to carry out an absorption and/or an adsorption of gas around three times greater thanks to the three faces 114, 116 and 118 exposed.

The first opening 112 makes it possible to expose the faces 114 and 116 of the layers 104 and 106 to the environment external to the getter structure 100. Generally speaking, the getter structure 100 may comprise one or more first openings 112 crossing through the second layer 106. The getter structure 100 may in particular comprise several first openings 112 located at different places of the second layer 106. These first openings may further be of different sizes and/or shapes. In order that the second layer 106 retains a good gas absorption and/or adsorption capacity, the first opening(s) 112 are produced preferably such that the surface occupied by this or these first openings 112 at the level of the faces 116 and 118 is less than or equal to around 20% of the total surface of the face 118 (the total surface of a face corresponding to the sum of the surface of getter material at the level of this face and the empty surface formed by the first opening(s) 112 at the level of this face).

Apart from the role of placing in communication the first space 110 with the environment external to the getter structure 100, the first opening(s) 112 also serve, during the production of the getter structure 100, to form accesses to a first layer of sacrificial material arranged between the layers 104 and 106 in order to etch partially this first layer of sacrificial material, one or the remaining portions of this first layer of sacrificial material corresponding to the first portion(s) 108.

The first opening(s) 112 are advantageously produced, in terms of shapes, dimensions and locations in the second layer 106, such that it is possible to properly control the structure of the remaining portions of the first layer of sacrificial material forming the first portion(s) 108, and/or facilitate the etching of the first layer of sacrificial material. This etching is carried out preferably such that the part of the surface of the face 116 of the second layer 106 which is in contact with the first portion(s) 108 corresponds to around 20% or less of the total surface of the face 118. This same proportion is also found for the face 114 of the first layer 104. Nevertheless, the first portion(s) 108 have a sufficient contact surface with the layers 104 and 106 to assure good mechanical stability of the getter structure 100.

Figure 15:
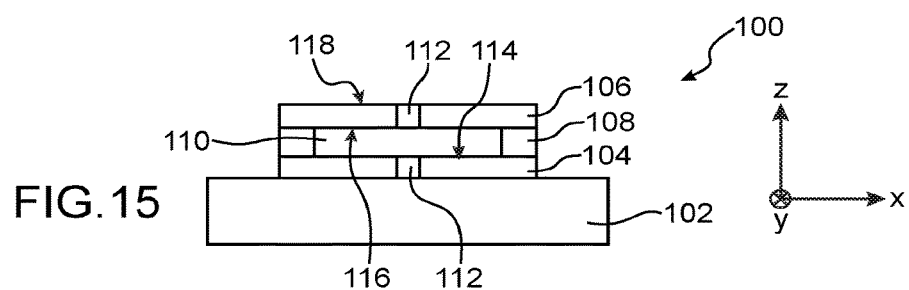
FIG. 15 shows a sectional side view of a getter structure according to a variant of the first embodiment.

FIG. 15 shows a sectional view of the getter structure 100 according to a variant of the first embodiment described previously.

Compared to the getter structure 100 described previously in conjunction with FIGS. 1 and 2, this getter structure 100 according to this variant differs due to the fact that the first opening(s) 112 also cross through at least one part of the first layer 104. In the example of FIG. 15, the opening 112 crosses through the second layer 106 as well as the whole thickness of the first layer 104. Such an opening 112 is advantageously produced by RIE through the two layers 104 and 106. Such a variant may in particular be carried out when the materials of the layers 104 and 106 cannot be etched selectively with respect to each other, for example in the case of a same getter material used to form the layers 104 and 106.

Figure 16:
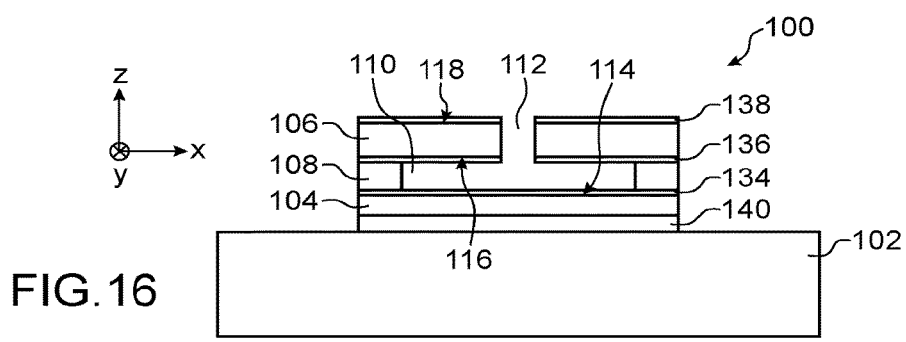
FIG. 16 shows a sectional side view of a getter structure according to a variant of the first embodiment.

FIG. 16 shows a sectional view of the getter structure 100 according to another variant of the first embodiment described previously.

Compared to the getter structure 100 described previously in conjunction with FIGS. 1 and 2, this getter structure 100 according to this variant comprises protective layers 134, 136 and 138 protecting respectively the faces 114, 116 and 118 of the layers of getter material 104 and 106. The protective layers 136, 138 are crossed by the opening 112. These protective layers 134, 136, 138 make it possible particularly to protect the layers 104, 106 from chemical aggressions which are capable of taking place during and/or subsequent to the production of the getter structure 100, without altering the pumping capacity of the getter materials of the layers 104, 106. For example, when the first portion 108 is formed by etching a layer of sacrificial material initially arranged between the layers 104 and 106, the etching implemented is generally an etching using oxidising plasmas which can contribute to reducing the pumping capacity of the getter materials in the absence of protection of the getter materials, on account of the oxides that form on the surface of the getter materials. When the first portion 108 is formed by etching of a sacrificial layer initially arranged between the layers 104 and 106, these protective layers 134, 136, 138 comprise one or more materials different to that or those of the sacrificial layer in order that these protective layers are not affected by the etching implemented to form the first portion 108. For example, the materials of the protective layers 134, 136, 138 may comprise Au and/or Cr and/or an oxide of the alloy or metal forming the getter material against which the protective layer is produced and/or a nitride of the alloy or metal forming the getter material against which the protective layer is produced. Moreover, the thicknesses of the protective layers 134, 136 and 138 may each be comprised between several nanometers and several tens of nanometers, for example less than around 100 nm or less than around 50 nm.

Although in FIG. 16 the three faces 114, 116 and 118 are each protected by one of the protective layers 134, 136, 138, it is possible that a single or two of these faces 114, 116, 118 are protected by one or two of these protective layers 134, 136, 138.

An adjustment sub-layer 140 capable of regulating the thermal activation temperature of the getter material of the first layer 104 is arranged under the first layer 104 of getter material, between the support 102 and the first layer 104. Such an adjustment sub-layer 140 does not serve as layer of sacrificial material. This adjustment sub-layer 140 may be a metal layer comprising one or more of the following materials: Ru, Cr, Ni, Cu, Al, Au, and Pt. Details for producing such an adjustment sub-layer are given in the document FR 2 922 202.

In a variant, the layer 138 may correspond not to a protective layer as described previously, but to a reflective layer forming the front face of the getter structure and capable of reflecting an infrared radiation received by the getter structure 100 at this front face.

Figure 3:
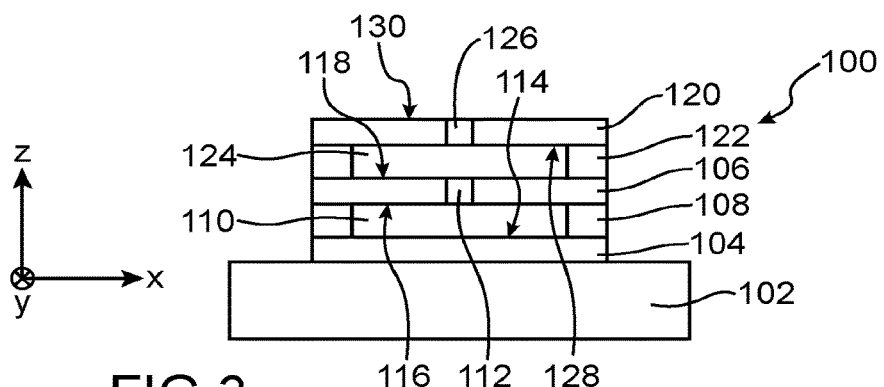
FIG. 3 shows a sectional view of a getter structure according to a second embodiment.

FIG. 3 shows a top view of the getter structure 100 according to a second embodiment.

The getter structure 100 according to this second embodiment comprises all the elements described previously for the first embodiment.

It also comprises a third layer of getter material 120 such that the second layer 106 is arranged between the first layer 104 and the third layer 120. The third layer 120 is for example similar (in terms of dimensions, shape and type of getter material) to the second layer 106. This third layer 120 is mechanically supported by one or more second portions 122 of material formed on the face 118 of the second layer 106 and which space the layers 106 and 120 apart from each other while forming a second space 124 between these layers 106 and 120. In the example of FIG. 3, a single second portion 122 (here similar to the first portion 108 in terms of shape, dimensions and type of material) is arranged between the layers 106 and 120, at the periphery of these layers. The third layer 120 is crossed by one or more second openings 126 (only one in the example of FIG. 3) making the second space 124 communicate with the external environment of the getter structure 100.

In contact with gaseous species, such a getter structure 100 thus carries out an absorption and/or an adsorption of gas from:
- the first face 114 of the first layer 104 which is exposed in the first space 110;
- the first face 116 of the second layer 106 which is exposed in the first space 110;
- the second face 118 of the second layer 106 which is exposed in the second space 124;
- a first face 128 of the third layer 120 which is exposed in the second space 124;
- a second face 130 of the third layer 120 which is opposite to the first face 128 and which here forms the upper face of the getter structure 100.

To a lesser extent, the absorption/adsorption of gas is also carried out by the lateral faces (substantially perpendicular to the faces 114, 116, 118, 128, 130) of the layers 104, 106 and 120 as well as by the lateral walls of the openings 112 and 126.

Thus, compared to a getter structure which would be formed of a single layer of getter material arranged on the support 102 and which would thus carry out an absorption and/or an adsorption of gas uniquely by its upper face, the getter structure 100 according to this second embodiment makes it possible to carry out an absorption and/or an adsorption of gas around five times greater thanks to the five faces 114, 116, 118, 128 and 130 exposed.

Generally speaking, the getter structure 100 according to this second embodiment may comprise one or more second openings 126 crossing through the third layer 120. The getter structure 100 may in particular comprise several second openings 126 located at different places of the third layer 120. These second openings 126 may moreover be of different sizes and/or shapes. In order that the third layer 120 retains a good absorption and/or adsorption capacity, the second opening(s) 126 are produced preferably such that the surface occupied by this or these second openings 126 at the level of the faces 128 and 130 is less than or equal to around 20% of the total surface of the face 130.

Apart from the role of placing in communication the spaces 110 and 124 with the environment external to the getter structure 100, the second opening(s) 126 also serve, during the production of the getter structure 100, to form accesses to the first layer of sacrificial material arranged between the layers 104 and 106 (via the first opening(s) 112) and to a second layer of sacrificial material arranged between the layers 106 and 120, in order to etch partially the first and second layers of sacrificial material. The remaining portion(s) of the first layer of sacrificial material correspond to the first portion(s) 108, and the remaining portion(s) of the second layer of sacrificial material correspond to the second portion(s) 122.

The second opening(s) 126 are advantageously produced, in terms of shapes, dimensions and locations in the third layer 120, such that it is possible to properly control the structure of the remaining portions of the second layer of sacrificial material forming the second portion(s) 122, and/or to facilitate the etching of the second layer of sacrificial material. This etching is preferably carried out such that the part of the surface of the face 128 of the third layer 120 which is in contact with the second portion(s) 122 corresponds to around 20% or less of the total surface of the face 130. This same proportion is also found for the face 118 of the second layer 106. Nevertheless, the second portion(s) 122, and the first portion(s) 108, have a sufficient contact surface with the different layers of getter material to assure good mechanical stability of the whole getter structure 100.

As described previously for FIG. 15, the first opening(s) 112 may also cross through at least one part of the thickness of the first layer 104.

As described previously for FIG. 16, one or more faces 114, 116, 118, 128, 130 of the layers 104, 106 and 120 may be protected by protective layers analogous to the layers 134, 136, 138 described previously.

Figure 4:
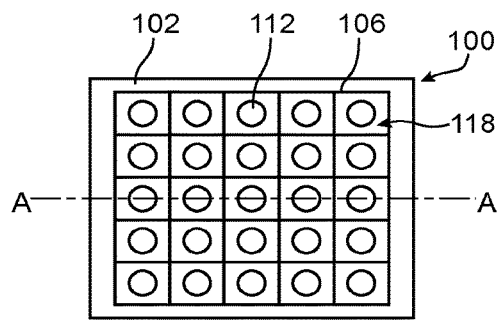
FIGS. 4 and 5 show respectively a top view and a sectional side view of a getter structure according to a first variant of the first embodiment.
Figure 5:
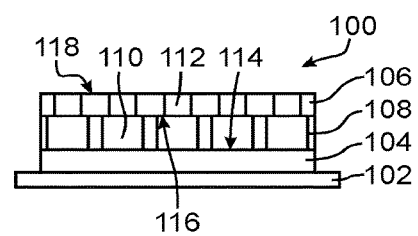

FIGS. 4 and 5 show respectively a top view and a sectional view of a getter structure 100 according to a first variant of the first embodiment. FIG. 5 is a sectional view along the axis AA visible in FIG. 4.

In this first variant, the getter structure 100 comprises several first openings 112 regularly spread out in the second layer 106 (25 in number in this example).

In FIG. 4, the second layer 106 is shown symbolically as an array of rectangular portions arranged beside each other forming 5 lines and 5 columns, and each crossed in its centre by one of the first openings 112. Furthermore, several first portions 108 are arranged in the first space 110 between the layers 104 and 106. The first layer 104 may also be seen as an array of 25 rectangular portions arranged next to each other, as for the second layer 106, these portions not being crossed by openings.

Considering "Co" as corresponding to the total gas pumping capacity, or absorption and/or adsorption capacity, of the first layer 104 arranged on the support 102, the pumping capacity of each of the 25 rectangular portions of the second layer 106 (which is of dimensions, shape and nature similar to the first layer 104) is equal to around Co/25. Thus, the pumping capacity of the getter structure 100 shown in FIGS. 4 and 5 is equal to around 25*3*Co/25=3*Co (the factor 3 is obtained on account of the exposure of the three faces 114, 116 and 118 of the layers 104 and 106). Strictly speaking, if the parts of the surfaces of getter material lost at the locations of the first openings 112 and the portions 108 are taken into account, the pumping capacity of the getter structure 100 is less than that indicated above. For example, by considering that each of the rectangular portions forming the layers 104 and 106 has a square shape of surface So equal to 100 µm² (surface So of a main face of one of the portions), that is to say having sides of dimension equal to 10 µm each, and comprises a first opening 112 and portions 108 occupying around 10% of the total surface So of this portion, the total pumping capacity of the getter structure 100 is then equal to around 2.6*Co. Taking account of the surface of getter material developed around each opening 112, the gain in surface of getter material is around $e*So^{0.5}$, where e represents the thickness of the layer 106. For a surface So equal to 100 µm² and a thickness e equal to 1 µm, the gain in surface is of the order of 10 µm², i.e. in total a pumping capacity of around 2.7*Co.

Figure 6:
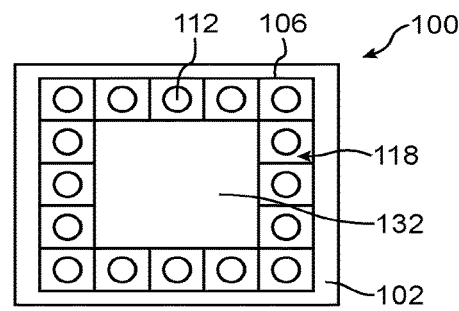
FIGS. 6 and 7 show top views of a getter structure according to the second and third variants of the first embodiment.

FIG. 6 shows a top view of a getter structure 100 according to a second variant of the first embodiment.

In this second variant, the layers 104 and 106 each have a section, in a plane parallel to the faces 118, 116 and 114, of rectangular frame shape. Each of the layers 104 and 106 may thus be shown symbolically as corresponding to rectangular portions (16 in number in the example of FIG. 6) arranged around an empty space 132 (occupying a volume equal to that of 9 rectangular portions each of dimensions similar to those of one of the 16 portions of each of the layers 104 and 106).

Considering the pumping capacity Co defined previously for the example shown in FIGS. 4 and 5, the pumping capacity of the getter structure 100 shown in FIG. 6 is equal to around 16*3*Co/25=1.92*Co. Considering the surface occupied by the openings 112 and the portions 108 as described previously for the example of FIGS. 4 and 5, the pumping capacity of the getter structure 100 shown in FIG. 6 is equal to around 16*2.7*Co/25=1.73*Co.

Figure 7:
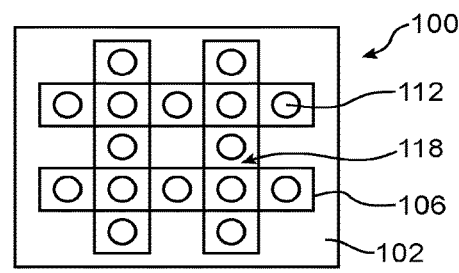

FIG. 7 shows a top view of a getter structure 100 according to a third variant of the first embodiment.

In this third embodiment example, the layers 104 and 106 each have a section, in a plane parallel to the faces 118, 116 and 114, of grid shape. Each of the layers 104 and 106 may thus be shown symbolically as corresponding to rectangular portions (16 in number in the example of FIG. 7) arranged in several lines and several columns spaced apart and intersecting each other.

Considering the pumping capacity Co defined previously for the first example shown in FIGS. 4 and 5, the pumping capacity of the getter structure 100 shown in FIG. 7 is equal to around 16*3*Co/25=1.92*Co, or more precisely equal to 16*2.7*Co/25=1.73*Co returning to the example described previously.

The variants of FIGS. 6 and 7 particularly make it possible to free zones of the support 102 on which it is not possible to deposit the getter material, for example on zones at the level of which optical functions are intended to be produced.

These variants may also apply to the second embodiment described previously in conjunction with FIG. 3. In this case, the third layer 120 has for example a shape and dimensions similar to those of layers 104 and 106.

Other variants may be envisaged, in which the layers of getter material of the getter structure 100 could have different shapes to those described previously.

Furthermore, it is also possible that the different layers of getter material of the getter structure 100 comprise different getter materials.

Figure 8:
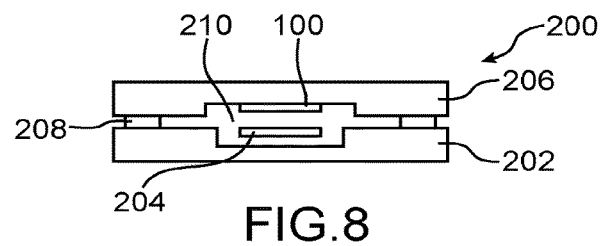
FIGS. 8 to 14 show sectional side views of several encapsulation structures according to different embodiment examples.

FIG. 8 shows a sectional side view of an encapsulation structure 200 according to a first embodiment example.

The structure 200 comprises a first substrate 202, for example made of semi-conductor such as silicon, in which is produced a micro-device 204, for example of MEMS type. The cover of the structure 200 is formed by a second substrate 206, for example also made of silicon, joined to the first substrate 202 by means of a bonding bead 208, or adherence interface. The micro-device 204 is encapsulated in a cavity 210 formed between the two substrates 202, 206 and which is delimited laterally by the bead 208.

A getter structure 100 corresponding to one of the getter structures described previously is arranged on the upper wall of the cavity 210, on the second substrate 206. The second substrate 206 thus corresponds to the support of the getter structure 100.

The getter structure 100 thus makes it possible to carry out an absorption and/or adsorption of gas present in the cavity 210 after the bonding of the two substrates 202, 206 via the bead 208.

Figure 9:
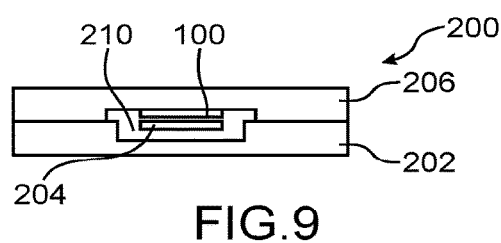

FIG. 9 shows a sectional side view of an encapsulation structure 200 according to a second embodiment example.

Compared to the structure 200 described previously in conjunction with FIG. 8, the assembly between the two substrates 202, 206 is carried out by a method of direct Si/Si or $SiO_2/SiO_2$ or metal/metal (depending on the nature of materials present at the interface between the substrates 202, 206) bonding, also called "Direct Bonding". It is also possible that the second substrate 206 is made of glass and that the first substrate 202 is made of silicon, the assembly being in this case carried out by anodic bonding.

Figure 10:
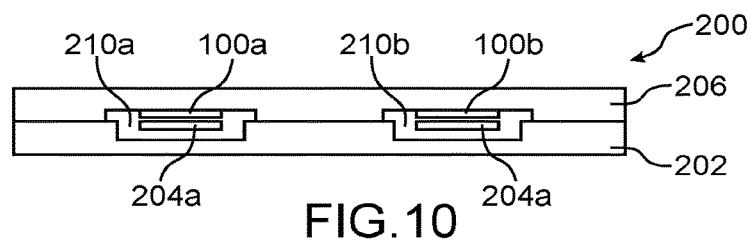

FIG. 10 shows a variant of the encapsulation structure 200 of FIG. 9. In this encapsulation structure, two micro-devices 204a, 204b are encapsulated in two separate cavities 210a, 210b and under different atmospheres. These different atmospheres are obtained due to the fact that the getter structures 100a, 100b have different absorption and/or adsorption capacities. These different capacities of the getter structures 100a, 100b may be obtained due to the fact that the dimensions and/or the shapes of the layers of getter material are different from one getter structure to the next, and/or the fact that the getter materials are different from one getter structure to the next. It is also possible to obtain different absorption and/or adsorption capacities from layers of getter material similar from one getter structure to the next, but by making the first openings 112 (and potentially the second openings 126) different (in terms of shape and/or number and/or dimensions) from one getter structure to the next. It is thus possible to modulate the pumping capacity of a getter structure with a factor comprised between around 1 and 3 when the getter structure is produced from two layers of getter material and a layer of sacrificial material.

A greater number of cavities and micro-devices may be envisaged than in the example of FIG. 10. Furthermore, this variant may be applied to the encapsulation structure 200 shown in FIG. 8.

In the embodiment examples of FIGS. 8 to 10, the getter structure(s) 100 are arranged on the second substrate 206 forming the cover of the encapsulation structure. In a variant, it is possible that the getter structure(s) 100 are arranged on the first substrate 202 at the level of which is located the micro-device 204. According to another variant, the encapsulation structure 200 may comprise at the same time one or more getter structures 100 arranged on the second substrate 206 and one or more getter structures 100 arranged on the first substrate 202.

Figure 11:
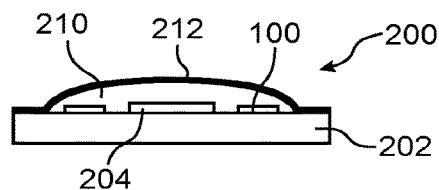

FIG. 11 shows the encapsulation structure 200 according to a third embodiment example.

Unlike the preceding embodiment examples of FIGS. 8 to 10, the cover of the encapsulation structure 200 is not formed by the second substrate 206 but by one or more thin layers 212, or cover layers, formed during a PCM type method of encapsulation (that is to say having formed firstly a portion of organic material of which the volume corresponds to the desired volume of the cavity 210 on the substrate 202, then by covering this portion of organic material with the thin layer(s) 212 intended to form the cover of the structure 200, then by etching the portion of organic material through at least one opening made in this or these thin layer(s)). In this encapsulation structure 200, the getter structure 100 is arranged on the substrate 202 and is shaped such that it surrounds the micro-device 204. The getter structure 100 has for example a frame shape as in the example described previously in conjunction with FIG. 6.

The number of thin layers 212 as well as the material(s) of this or these layers 212 and their thicknesses depend on the desired level of hermeticity and mechanical strength. The total thickness of the layers 212 forming the cover may be comprised between around 2 μm and 30 μm. These layers may comprise different materials depending on the properties desired for these layers and the atmosphere desired in the cavity 210 after its hermetic sealing. For example, all types of materials that can be deposited by PVD may be used to form the layers 212 of the cover (nitride or oxide of semi-conductor, metal, getter, etc.).

Figure 12:
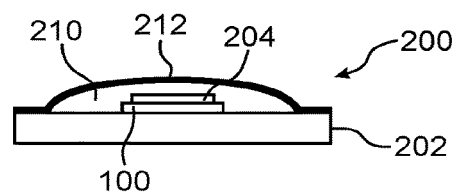

FIG. 12 shows the encapsulation structure 200 according to a fourth embodiment example. Compared to the third example of FIG. 11, the getter structure 100 is not produced such that it surrounds the micro-device 204, but is arranged entirely or in part under the micro-device 204. Such a configuration is advantageous for example when the micro-device 204 corresponds to a micro-bolometer, the getter structure 100 also serving as reflector to the infrared radiation received. In this fourth embodiment, the getter structure 100 advantageously comprises two layers of getter materials, for example similar to the layers 104 and 106 of which the upper face 114 of the first layer 104 is covered by the protective layer 134 and of which the lower face 116 of the second layer 106 is covered by the protective layer 136. The upper face 118 of the second layer 106 may be covered with a reflective layer capable of reflecting infrared radiation. In such a getter structure 100, the opening(s) 112 may have a diameter such that the material(s) deposited on the getter structure (for example polymer) during the production of the encapsulation structure 200 does not penetrate into the space 110, thereby avoiding any contact between the material(s) deposited and the getter material exposed in this space 110. Advantageously, this diameter may be comprised between 1 and several microns.

Figure 13:
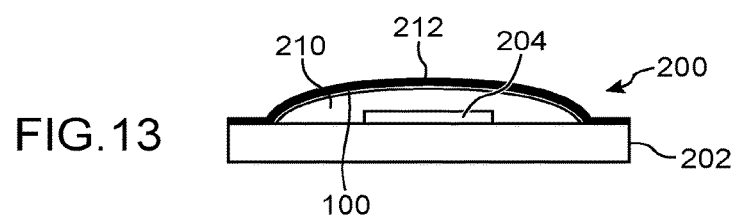

FIG. 13 shows the encapsulation structure 200 according to a fifth embodiment example.

Figure 14:
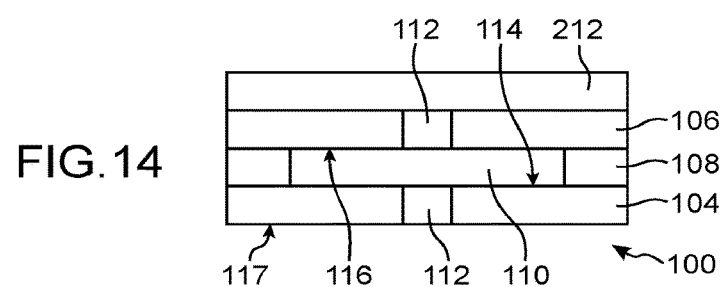

In this encapsulation structure 200, the getter structure 100 forms part of the cover and is arranged against the thin layer(s) 212 forming an inner wall of the cavity 210. FIG. 14 shows a more detailed view of a part of the cover thereby formed.

The elements of the getter structure 100 shown in FIG. 14 correspond to those of the getter structure 100 described previously in conjunction with FIGS. 1 and 2. The second layer 106 of the getter structure 100 is arranged against the thin layer(s) 212. The faces 114 and 116 of the layers of getter material 104, 106 are exposed to the atmosphere of the cavity 210 via the first opening(s) 112. The face 117 of the first layer 104 forms the inner wall of the cavity 110.

Advantageously, a protective layer is deposited on the sacrificial material serving for the production of the cavity 210 in order to avoid a direct contact between the first layer 104 of getter material and the sacrificial material.

The first opening(s) 112 are formed through the first and second layers 104 and 106. Thus, during the production of the encapsulation structure 200, it is possible to etch the portion of organic material on which the getter structure 100 and the thin layer(s) 212 are produced (a detailed description of this method of production is given hereafter). In FIG. 14, the openings 112 formed in the layers 104 and 106 are superimposed and aligned with each other. In a variant, it is possible that the opening(s) 112 crossing through the layer 104 are not superimposed and aligned with the opening(s) 112 crossing through the layer 106. Thus, in the case where the production of the layer(s) 212 can lead to the deposition of material through the opening(s) 112 of the layer 106, this material is deposited on the face 114 of the layer 104, which avoids any risk of deposition of the material(s) of the layer(s) 212 in the cavity 210 through the opening(s) 112 of the layer 104. This configuration thus makes it possible to avoid a potential pollution of the device 204 during the deposition of the sealing layer(s) 212.

In the example of FIGS. 13 and 14, it is considered that the first layer 104 of the getter structure 100 corresponds to the layer forming the inner wall of the cavity 210 because during the production of the getter structure, the first layer 104 is the first layer deposited on the portion of organic material. Nevertheless, it is possible to consider that the layer of material in contact with the thin layer(s) 212 (the second layer 106 in FIGS. 13 and 14) corresponds in fact to the first layer 104 and that the layer of getter material forming the inner wall of the cavity 210 corresponds to the second layer 106 (or the third 120 if the getter structure 100 comprises this third layer 120).

In all the modes, variants and examples of embodiments described previously, each getter structure may comprise layers of a same getter material, or instead different layers of getter materials. By producing the getter structure from different getter materials, it is thus possible to combine within the getter structure getter materials having different absorption and/or adsorption properties, which enables for example such a getter structure to selectively trap different gaseous species as a function of the getter materials used, and thus to better control the residual atmosphere in which the getter structure is placed. Apart from the different absorption and/or adsorption properties between two different getter materials, it is also possible to use advantageously their different etching aptitudes. In fact, for the two variants of the structure 100 of FIGS. 2 and 3, the material of the layer 104 may be zirconium, and that of the or the other layers of getter material (106 and potentially 120) may be titanium. The titanium may be shaped by RIE, since zirconium is resistant to this type of etching. The openings 112 are in this case located uniquely in the layers of titanium, without reducing the surface of getter material formed by zirconium, that is to say the surface of getter material of the layer 104.

An example of method for producing the encapsulation structure 200 described previously in conjunction with FIG. 8 or 9 is described below.

The micro-device 204 is firstly produced on and/or in the first substrate 202.

In parallel, the getter structure 100 is produced on the second substrate 206. The first layer 104 of getter material is firstly deposited on the second substrate 206. A layer of sacrificial material, advantageously capable of being etched selectively compared to the getter materials of the layers 104 and 106, is then produced on the first layer 104. The second layer 106 of getter material is then deposited on the layer of sacrificial material. When the getter structure 100 comprises more than two layers of getter material, as in the example of FIG. 3, the additional layer(s) of getter material and sacrificial material are also deposited such that a layer of sacrificial material is each time interposed between two layers of getter material. The protective layers of the different faces of the layers of getter material may advantageously be produced between these steps.

The different layers thereby formed have for example, in a plane parallel to the surface of the support on which these layers are produced (plane parallel to the face of the second substrate 206 on which the getter structure 100 is produced in the case described here), similar shapes and dimensions. The layers deposited are shaped for example by photolithography and etching.

The depositions of the layers of getter material and the layer(s) of sacrificial material and potentially protective layers are preferably carried out one after the other in a same deposition frame in order to avoid being placed again in the open air, and thus oxidation, of the layers deposited. For example, the layers of getter material and the layer(s) of sacrificial material may be deposited by evaporation under a vacuum of the order of $10^{-8}$ mbar to $10^{-6}$ mbar. However, the addition of at least one protective layer, particularly on the first layer 104 of getter material, can make it possible to interrupt the cycle of deposition of layers and to change to another deposition material even if this leads to an exposure to ambient air of the getter structure during production.

The first opening(s) 112 are then produced by photolithography and etching by dry process (for example of RIE type) through the second layer 106 and the layer of sacrificial material (and the potential protective layer(s)). If the getter structure comprises more than two layers of getter material, this etching is carried out through all the layers of the stack except the first layer 104, and thus forms the other openings through the other layers of getter material (second openings 126 as in the example of FIG. 3).

The layer(s) of sacrificial material are then partially etched, advantageously by wet process, through the opening(s) formed through the layer(s) of getter material. The remaining portions of the layer(s) of sacrificial material form the portions of material interposed between the layers of getter material (first portion 108 in the example of FIGS. 1 and 2, and first and second portions 108 and 122 in the example of FIG. 3).

The two substrates 202 and 206 are then bonded to each other in order to form the cavity 210 in which the micro-device 204 is encapsulated. All bonding modes compatible with W2W type encapsulation may be used: eutectic bonding (for example from an alloy of AuSn to form the bonding bead 208 and carried out at a temperature greater than or equal to around 280° C., or instead from an alloy of AuSi and at a temperature greater than or equal to around 360° C., or instead from an alloy of AlGe and at a temperature greater than or equal to around 419° C.), with or without isothermal solidification method (also called TLPB for "Transient Liquid Phase Bonding", or SLID Bonding for "Solid Liquid InterDiffusion Bonding"), anodic bonding when one of the substrates 202 or 206 is made of glass, direct bonding as for the example of FIG. 9 (Si/Si when the substrates 202 and 206 are made of silicon, $SiO_2/SiO_2$ when portions of $SiO_2$ are formed beforehand on the substrates 202 and 206, metal/metal when metal portions are formed beforehand on the substrates 202 and 206).

The thermal activation of the getter material(s) is carried out during the operation of bonding the two substrates 202 and 206 and/or by an additional post-bonding heat treatment.

An example of method for producing the encapsulation structure 200 described previously in conjunction with FIG. 11 or 12 is described below.

The micro-device 204 is firstly produced on and/or in the substrate 202. The getter structure(s) 100 are then produced on the substrate 202 as described previously. In the case of the encapsulation structure shown in FIG. 12, the getter structure(s) 100 intended to be arranged under the micro-device 204 are produced prior to the micro-device 204.

A portion of organic material, for example polymer, such as a resin advantageously photosensitive, covering at least the micro-device 204 and the getter structure 100 is then produced by deposition and photolithography (and potentially etching if the organic material is not photosensitive) on the substrate 202. This portion of organic material is produced according to the desired shape and the dimensions for the cavity 210. A heat treatment for creep shaping the portion of organic material may be implemented. The thickness of the portion of organic material can vary between around 2 micron and 50 microns.

The cover layer 212 (or layers 212 when the cover is formed by a superposition of different layers) is then deposited by covering the portion of organic material.

One or more openings are then produced through the layer(s) 212, then the portion of organic material is etched, for example by dry process using an oxidising plasma at temperature for example at around 250° C., through this or these openings. The opening(s) have for example, in the plane of the layer(s) 212, dimensions (for example the diameter in the case of an opening of circular shape) comprised between around 1 and 10 microns.

Finally, a sealing layer, which may correspond to a hermetic layer covering the cover layer 212 or instead to one or more portions of hermetic material located at the opening(s) crossing through the cover, is then formed on the layer(s) 212. This closing of the opening(s) may be carried out under a particular atmosphere (pressure, nature of the gases present) which corresponds to that desired in the cavity 210. The sealing layer is advantageously made of metal or getter material (which may be identical to the or to one of the getter materials of the getter structure 100) and which is going to make it possible to complete the pumping capacity of the getter structure 100.

An example of method for producing the encapsulation structure 200 described previously in conjunction with FIGS. 13 and 14 is described below.

The micro-device 204 is firstly produced on and/or in the substrate 202. Potentially, one or more getter structures 100 are produced on the substrate 202 as described previously.

A portion of organic material covering at least the micro-device 204, and potentially the getter structure(s) 100 present on the substrate 202, is then produced by deposition and photolithography (and potentially etching if the organic material is not photosensitive) on the substrate 202. This portion of organic material is shaped according to the shape and the dimensions desired for the cavity 210.

The different layers of the getter structure 100 intended to form part of the cover are then deposited successively on the portion of organic material. On account of the organic nature of the material, it is possible to deposit, prior to the deposition of the layers of the getter structure 100, a mineral or metal layer (for example a layer of silicon dioxide or nitride deposited by CVD, or instead a metal layer deposited by PVD sputtering) on the portion of organic material in order to avoid polluting the getter materials, during their deposition, by volatile organic compounds derived from the portion of organic material. Such a protective layer, corresponding to a thick protective layer, may have a thickness comprised between around 200 nm and 1 micron. The addition of this thick protective layer protecting the getter materials has the effect of covering the external surface of the layer of getter material intended to be exposed in the cavity (surface 117 in the example of FIGS. 13 and 14) which reduces the total adsorption/absorption surface of the getter structure 100. Nevertheless, a thinner protective layer similar to the layers 134, 136, 138 described previously and the thickness of which is comprised between several nanometers and several tens of nanometers, does not alter the pumping capacity of the getter material.

The opening(s) 112 are then made through the layers of the getter structure, and the layer(s) of sacrificial material are partially etched, as described previously. The portion of organic material is then removed by etching.

The sealing of the opening(s) 112 serving as release holes is then carried out, for example by a PVD, for example under controlled atmosphere (in terms of pressure and type of gases).

In all the modes, variants and examples of embodiments described previously, the or each layer of sacrificial material arranged between two layers of getter material may serve as adjustment sub-layer to regulate the thermal activation temperature of the layer of getter material (for example the second layer 106 in the example of FIGS. 1 and 2) situated on the layer of sacrificial material. To do so, the layer of sacrificial material may be a metal layer comprising one or more of the following metals: Ru, Cr, Ni, Cu, Al, and Au. Thus, it is possible to regulate the thermal activation temperatures of the getter materials of the getter structure 100 such that the getter material situated on such a layer of sacrificial material is activated at lower temperature than the getter material found under this layer of sacrificial material. It is thus possible to adjust the pressure in the cavity after sealing according to two different thermal cycles (or more than two cycles if the getter structure comprises more than two layers of getter material). An adjustment sub-layer may also be arranged under the first layer 104 of getter material, between the support and the first layer 104. Such an adjustment sub-layer does not serve as layer of sacrificial material. In this case, this adjustment sub-layer may be a metal layer comprising one or more of the following materials: Ru, Cr, Ni, Cu, Al, Au, and Pt. Details for producing such adjustment sub-layers are given in the document FR 2 922 202.

Moreover, in all the modes, variants and examples of embodiment described previously, one or the layers of getter materials of the or each of the getter structures may be protected by forming, around and/or on this or each of these layers, a protective layer obtained by nitridation and/or oxidation of the getter material by oxygen and/or nitrogen in medium exempt of water vapour, as described in the document FR 2 950 876. This oxidation and/or nitridation may be carried out at a temperature comprised between around 80° C. and 120° C., under a pressure comprised between atmospheric pressure and around $10^{-2}$ mbar, for a duration comprised between several minutes and several tens of minutes. The external faces of the layers of getter materials can thus be protected vis-à-vis the ambient atmosphere or any chemical alteration which could be caused by external gases. During the method for producing the getter structure, each layer of getter material may be protected by forming the protective layer just after the deposition of the layer of getter material. It is also possible that the layers of getter material of the getter structure are protected by a same overall protective layer formed after the etching of the layer(s) of sacrificial material during the production of the getter structure.

The invention claimed is:

1. A getter structure, comprising:
    a substrate support;
    a first layer of getter material disposed on the substrate support;
    a second layer of getter material, the first layer of getter material being disposed between the substrate support and the second layer of getter material;
    a first portion of material mechanically connecting a first face of the second layer of getter material to a first face of the first layer of getter material and forming at least one first empty space delimited by the first faces of the first and second layers of getter material and the first portion of material and being configured to allow a circulation of gas between the first faces of the first and second layers of getter material; and
    a first opening crossing through at least the second layer of getter material and emerging into the first space,
    wherein the getter materials of the first and second layers comprise at least one of the following elements: Ti, Zr, and V.

2. The getter structure according to claim 1, further comprising:
    a third layer of getter material, the second layer of getter material being disposed between the first layer of getter material and the third layer of getter material;
    a second portion of material mechanically connecting a first face of the third layer of getter material to a second face of the second layer of getter material and forming at least one second space between said faces of the second and third layers of getter material and being configured to allow a circulation of gas between said faces of the second and third layers of getter material; and
    a second opening crossing through at least the third layer of getter material and emerging into the second space.

3. The getter structure according to claim 2,
    wherein a material of the first portion is configured to be etched selectively compared to the getter materials of the first and second layers, and/or
    wherein a material of the second portion is configured to be etched selectively at least compared to the getter materials of the second and third layers.

4. The getter structure according to claim 3,
    wherein the getter materials of the first and second layers comprise at least one of the following elements: Ti, Zr, and V, and the material of the first portion comprises at least one of the following elements: Ru, Cr, Cu, Ni, Al, and Au, and/or
    wherein the getter materials of the second and third layers comprise at least one of the following elements: Ti, Zr, and V, and the material of the second portion comprises at least one of the following elements: Ru, Cr, Cu, Ni, Al, and Au.

5. The getter structure according to claim 2,
    wherein the second layer of getter material comprises a section, in a plane parallel to the second face of the second layer of getter material, having a rectangular frame shape or a grid shape, and/or
    wherein the third layer of getter material comprises a section, in a plane parallel to a second face of the third layer of getter material, having a rectangular frame shape or a grid shape.

6. The getter structure according to claim 1, further comprising n superimposed layers of getter material, spaced apart and structured such that 2n-1 active faces of getter material are configured to be in contact with one or more gases and to absorb and/or adsorb said gases, where n is a whole number such that n >1.

7. The getter structure according to claim 1, wherein a material of the first portion is configured to be etched selectively compared to the getter materials of the first and second layers.

8. The getter structure according to claim 7, a material of the first portion comprises at least one of the following elements: Ru, Cr, Cu, Ni, Al, and Au.

9. The getter structure according to claim 1, further comprising:
    several first portions of material mechanically connecting the first face of the second layer of getter material to the first face of the first layer of getter material; and/or
    several first openings regularly spread out in the second layer of getter material.

10. The getter structure according to claim 9, wherein:
    the first openings comprise a total surface area, in a plane parallel to the second face of the second layer of getter material, less than or equal to around 20% of a total surface area of the second face of the second layer of getter material, and/or
    a part of the surface of the first face of the second layer of getter material that is in contact with the first portions of material has an area that is less than or equal to around 20% of the total surface area of the second face of the second layer of getter material.

11. The getter structure according to claim 1, wherein the second layer of getter material comprises a section, in a plane parallel to a second face of the second layer of getter material, having a rectangular frame shape or a grid shape.

12. The getter structure according to claim 1, further comprising at least one sub-layer configured to adjust a thermal activation temperature of the getter material of the first layer, disposed between the substrate support and the first layer of getter material and including at least one of the following elements: Ru, Pt, Cr, Cu, Ni, Al, and Au.

13. The getter structure according to claim 1, further comprising at least one protective layer covering at least one of the faces of at least one of the layers of getter material.

14. The getter structure according to claim 13, wherein a material of the at least one protective layer comprises at least one of the following materials:
    Au, Cr, an oxide of an alloy or a metal forming the getter material against which the at least one protective layer is arranged, and a nitride of an alloy or a metal forming the getter material against which the at least one protective layer is arranged.

15. The getter structure according to claim 1, further comprising at least one layer configured to reflect infrared radiation, disposed on a face of at least one of the layers of getter material and forming a front face of the getter structure.

16. An encapsulation structure, comprising:
    at least one hermetically sealed cavity delimited by first and second substrates and in which at least one microdevice is disposed on and/or in the first substrate;
    at least one first getter structure according to claim 1, wherein the substrate support of the first getter structure is formed by the first substrate; and/or
    at least one second getter structure according to claim 1, wherein the substrate support of the second getter structure is formed by the second substrate.

17. An encapsulation structure, comprising:
    at least one hermetically sealed cavity delimited by a substrate and a cover and in which at least one microdevice is disposed on and/or in the substrate;

at least one first getter structure according to claim 1 forming at least one inner wall of the at least one hermetically sealed cavity; and/or at least one second getter structure according to claim 1, wherein the substrate support of the second getter structure is formed by the substrate.

18. The getter structure according to claim 2, further comprising:

several first portions of material mechanically connecting the first face of the second layer of getter material to the first face of the first layer of getter material; and/or several first openings regularly spread out in the second layer of getter material; and/or several second portions of material mechanically connecting the first face of the third layer of getter material to the second face of the second layer of getter material; and/or several second openings regularly spread out in the third layer of getter material.

19. The getter structure according to claim 18, wherein:

the first openings comprise a total surface area, in a plane parallel to the second face of the second layer of getter material, less than or equal to around 20% of a total surface area of the second face of the second layer of getter material, and/or the second openings comprise a total surface area, in a plane parallel to a second face of the third layer of getter material opposite to the first face of the third layer of getter material, less than or equal to around 20% of a total surface area of the second face of the third layer of getter material, and/or a part of the surface of the first face of the second layer of getter material that is in contact with the first portions of material has an area that is less than or equal to around 20% of the total surface area of the second face of the second layer of getter material, and/or a part of the surface of the first face of the third layer of getter material that is in contact with the second portions of material has an area that is less than or equal to around 20% of the total surface area of the second face of the third layer of getter material.

* * * * *